United States Patent
Yu et al.

[11] Patent Number: 5,760,631
[45] Date of Patent: Jun. 2, 1998

[54] PROTECTION CIRCUIT FOR A CMOS INTEGRATED CIRCUIT

[75] Inventors: Ta-Lee Yu, Hsien; Ling-Yen Yeh. Taipei, both of Taiwan

[73] Assignee: Winbond Electronics Corp., Hsinchu, Taiwan

[21] Appl. No.: 685,309

[22] Filed: Jul. 23, 1996

[30] Foreign Application Priority Data

Apr. 24, 1996 [TW] Taiwan ................. 85104895

[51] Int. Cl.[6] ............................................ G05F 1/20
[52] U.S. Cl. ............... 327/313; 327/327; 327/328; 327/545
[58] Field of Search ........................... 327/313, 327, 327/328, 427, 543, 545, 546, 538, 540

[56] References Cited

U.S. PATENT DOCUMENTS

| | | | |
|---|---|---|---|
| 3,407,339 | 10/1968 | Booher | 327/313 |
| 5,397,934 | 3/1995 | Merrill et al. | 327/537 |
| 5,434,534 | 7/1995 | Lucas | 327/546 |
| 5,485,117 | 1/1996 | Furumochi | 327/538 |
| 5,504,452 | 4/1996 | Takenaka | 327/541 |
| 5,523,714 | 6/1996 | Topp et al. | 327/427 |

FOREIGN PATENT DOCUMENTS

401305615 A   12/1989   Japan ................. 327/427

Primary Examiner—Timothy P. Callahan
Assistant Examiner—An T. Luu
Attorney, Agent, or Firm—Fish & Richardson P.C.

[57] ABSTRACT

A protection circuit for a CMOS integrated circuit which is biased with a first voltage and a second voltage includes a voltage divider, a voltage comparator, and a switch. The full level of the first voltage is higher than that of the second voltage. The voltage divider divides the first voltage to be compared with the second voltage in the voltage comparator. The switch is controlled by the voltage comparator. The switch isolates the CMOS integrated circuit from the first voltage when the first voltage is lower than the second voltage. Therefore, no forward bias current path exists in the CMOS integrated circuit even though the voltage levels of the first and second voltages reach their full levels at different times.

6 Claims, 3 Drawing Sheets

5,760,631

PROTECTION CIRCUIT FOR A CMOS INTEGRATED CIRCUIT

BACKGROUND OF THE INVENTION

1. Field of the Invention

The present invention relates to a protection circuit for a CMOS integrated circuit, and more specifically, to a latch-up protection circuit for a multiple voltage source CMOS integrated circuit.

2. Description of Prior Art

In order to support various applications, a CMOS integrated circuit is often provided with more than one power supply voltage level. Referring to FIG. 1 for example, the cross-sectional view of a conventional CMOS integrated circuit including an NMOS and a PMOS transistor in a silicon substrate 10 is illustrated. The PMOS transistor consists of two P-type diffusion regions 12 and a gate 14 in an N-type silicon substrate 10. The NMOS transistor, which is fabricated in a P-type well, consists of two N-type diffusion regions 22 and a gate 24. A first voltage VCC is applied to N-type substrate 10 through an N-type diffusion region 16. P-type well 20 is biased by another voltage VSS through a P-type diffusion region 26. If the CMOS transistor is driven by another voltage, for example, the source of the PMOS transistor is biased with second voltage VDD which is lower than first voltage VCC, the CMOS transistor is a multiple voltage source circuit.

In a multiple voltage source CMOS circuit, the different voltages may not reach their full levels at the same time when the circuit is first turned on. A five-volt voltage power supply, for instance, requires about 5 to 100 milliseconds to reach its full five-volt level from zero. A three-volt voltage power supply level, on the other hand, can reach a three-volt level sooner than that. Therefore, when the lower voltage supply reaches its full level sooner than the higher voltage supply, as illustrated in FIG. 2, an interval T exists in which the voltage level of the lower voltage supply is higher than that of the higher voltage supply. Under these circumstances, the CMOS transistor is abnormally biased during interval T and latch-up tends to occur in the circuit, thus damaging the circuit.

Latch-up damage occurs when a forward-bias path exists between diffusion regions 12 and 16 in substrate 10, as is indicated by the dashed line of FIG. 1. Referring to FIG. 1, when the voltage level of second voltage VDD is higher than that of first voltage VCC, P-type diffusion region 12 has a higher voltage than N-type diffusion region 16, and a forward-bias path is formed in substrate 10 to conduct a large current flow directly from voltage supply VDD to voltage supply VCC. Therefore, the CMOS transistor will be damaged due to the high power of the large forward current.

A conventional method to prevent forward current paths in a CMOS circuit is the use of guard rings. The guard rings are often located near the input/output portions of the CMOS circuit to absorb the forward current. However, the aforementioned latch-up effect is not limited to only locations near the input/output portions, but can occur at any location where there are different voltages applied in the circuit. Therefore, using guard rings to solve the latch-up problem in a multiple voltage source CMOS circuit may be too complicated in some applications. Moreover, guard rings occupy a very large device area, and thus, may not satisfy the size requirements of a small geometry integrated circuit.

Other methods, have been proposed in U.S. Pat. No. 4,871,927 and No. 4,670,668, to overcome latch-up problems in CMOS circuits. However, the latch-up problem that these methods intend to overcome is different from the latch-up problem in multiple voltage source CMOS circuits. That is, these methods are ill-suited in addressing the latch-up problem solved by the present invention.

SUMMARY OF THE INVENTION

Accordingly, the present invention provides a protection circuit to prevent latch-up in a multiple voltage source CMOS circuit.

The present invention prohibits the formation of forward current paths in a CMOS circuit when the different voltage supplies connected to the circuit do not reach their full voltage levels at the same time, thereby preventing latch-up in the CMOS circuit.

In the preferred embodiment of the present invention, the CMOS integrated circuit is applied with a first voltage and a second voltage. The full level of the first voltage is higher than that of the second voltage. The protection circuit of the present invention includes a voltage divider, a voltage comparator, and a switch. The voltage divider divides the first voltage to be compared with the second voltage in the voltage comparator. The switch is controlled by the voltage comparator. The switch isolates the CMOS integrated circuit from the first voltage when the first voltage is lower than the second voltage. Therefore, there will be no forward bias current path in the CMOS integrated circuit even though the various voltage supplies reach their full levels at different times.

BRIEF DESCRIPTION OF THE DRAWINGS

Other objects, features, and advantages of the present invention will become apparent from the following detailed description of the preferred but non-limiting embodiment. The description is made with reference to the accompanying drawings, in which.

DETAILED DESCRIPTION OF THE INVENTION

Figure 1:
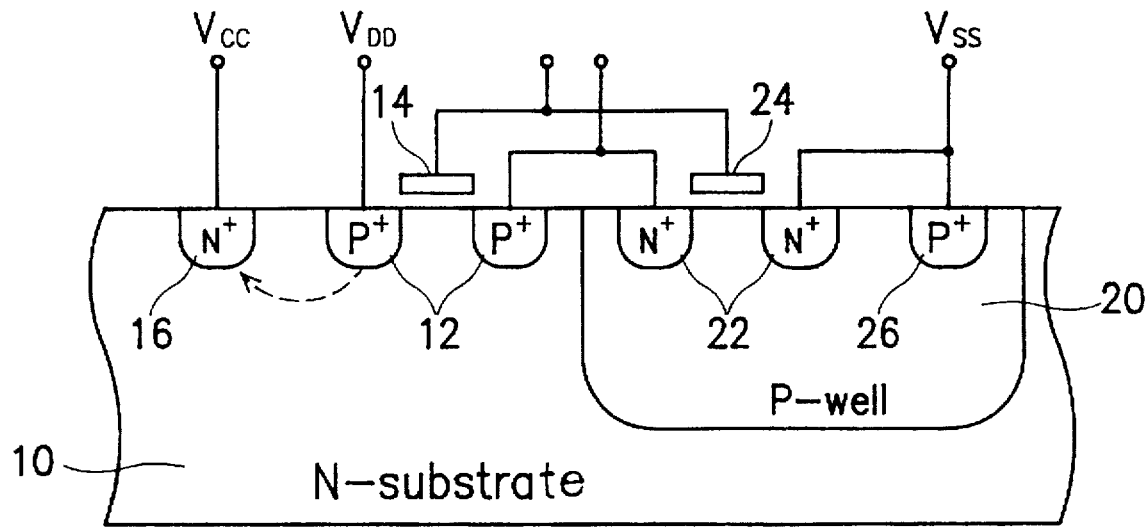
FIG. 1 is a cross-sectional view illustrating a conventional CMOS transistor in a silicon substrate.
Figure 2:
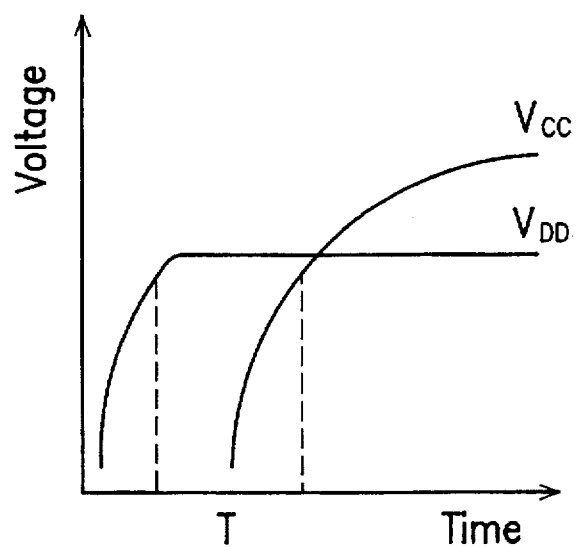
FIG. 2 is a plot illustrating the difference in the time needed for two voltage supplies to reach their full voltage levels.
Figure 3:
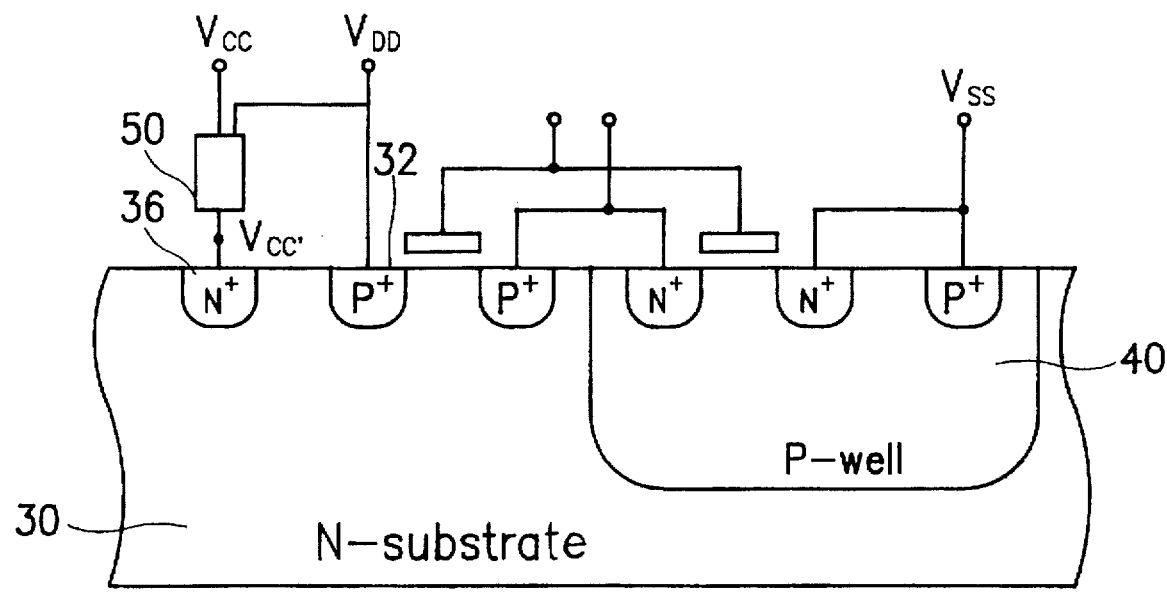
FIG. 3 is a cross-sectional view of the protection circuit of the present invention.

FIG. 3 illustrates a protection circuit 50 of the present invention used in connection with a CMOS integrated circuit similar to the conventional CMOS circuit of FIG. 1. The CMOS integrated circuit is formed in an N-type silicon substrate 30 which includes a P-type well 40. The CMOS circuit includes a PMOS transistor in N-type substrate 30 and an NMOS transistor in P-type well 40. The structures of the transistors will not be discussed in detail as they have been thoroughly described in the prior art. The CMOS integrated circuit is biased with a first voltage VCC and a second voltage VDD. In the described embodiment, the full level of first voltage VCC is about 5 volts, and that of the second voltage VDD is about 3.3 volts. That is, the full level of first voltage VCC is higher than second voltage VDD.

Referring to FIG. 3, protection circuit 50 is connected between first voltage VCC and N-type diffusion region 36 of the CMOS circuit. Thus, first voltage VCC is not directly applied to the CMOS circuit. Protection circuit 50 compares the voltage level of first voltage VCC with second voltage VDD and isolates the CMOS transistor from first voltage VCC when the first voltage level is too low. Therefore, even though second voltage VDD is applied to P-type diffusion region 32 of the PMOS transistor, no forward current path exists in substrate 30 since the first voltage VCC is isolated from the CMOS transistor.

Figure 4:
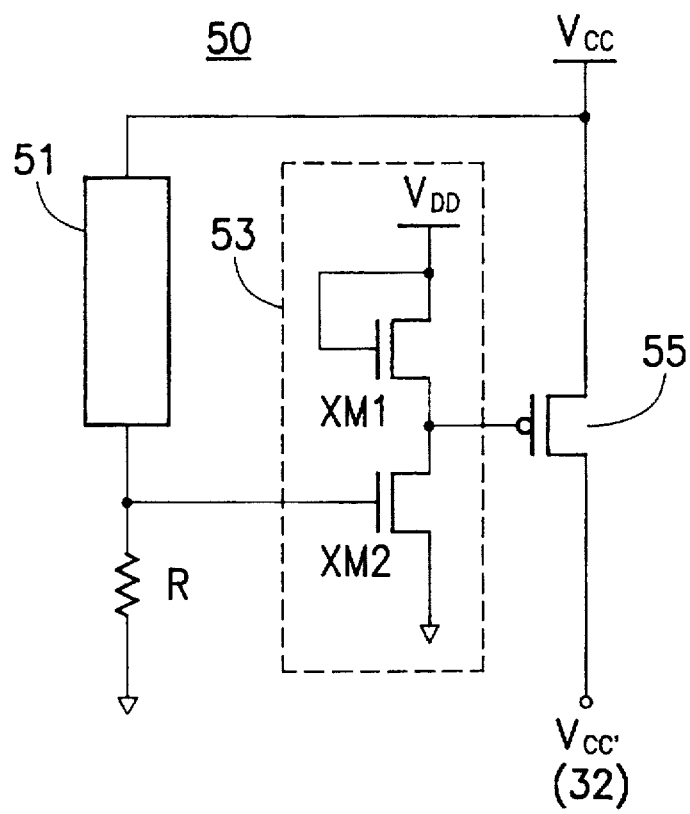
FIG. 4 is a circuit diagram of the protection circuit of the present invention.

Referring to FIG. 4, a circuit diagram of protection circuit 50 is shown including a voltage divider, a voltage comparator 53, and a switch 55. The voltage divider includes a constant voltage subtractor 51 and a load element R. The voltage divider divides first voltage VCC, by subtracting a constant voltage in subtractor 51, thereby generating a divided first voltage. The divided first voltage is then compared in voltage comparator 53. Load element R provides a current path between constant voltage subtractor 51 and ground. The constant voltage is determined by the voltage difference of first voltage VCC and second voltage VDD. Therefore, the structure of constant voltage subtractor 51 must be designed in accordance with the particular application of the CMOS integrated circuit and the voltage levels of the power supplies connected to the circuit. As the voltage levels of the various power supplies change, the constant voltage should be modified accordingly.

Voltage comparator 53 is connected to the voltage divider and compares the divided first voltage and second voltage VDD. Referring to FIG. 4, voltage comparator 53 includes a first NMOS transistor XM1 and a second NMOS transistor XM2. The drain and gate of first NMOS transistor XM1 are connected to second voltage VDD. The drain of second NMOS transistor XM2 is connected to the source of first NMOS transistor XM1, and forms an output to control switch 55. The gate of second NMOS transistor XM2 receives the divided first voltage from the voltage divider. Second NMOS transistor XM2 is grounded through the source. Voltage comparator 53 is equivalent to an inverter when second voltage VDD reaches its full level, then the inverted output of the divided first voltage becomes a control signal of switch 55.

Switch 55 is connected between first voltage VCC and the CMOS transistor. In the described embodiment, switch 55 can be a PMOS transistor having its gate controlled by voltage comparator 53. The source of PMOS transistor 55 is biased with first voltage VCC and the drain is connected to N-type diffusion region 36 (FIG. 3) of the CMOS transistor. PMOS transistor 55 is turned off to isolate the CMOS integrated circuit from first voltage VCC when the first voltage is lower than the second voltage. When the voltage level of first voltage VCC is high enough, PMOS transistor 55 will be turned on to provide first voltage VCC to the CMOS transistor. The voltage level of voltage VCC' at the drain of PMOS transistor 55 is almost the same as the voltage level of first voltage VCC when PMOS transistor 55 is turned on.

Figure 5:
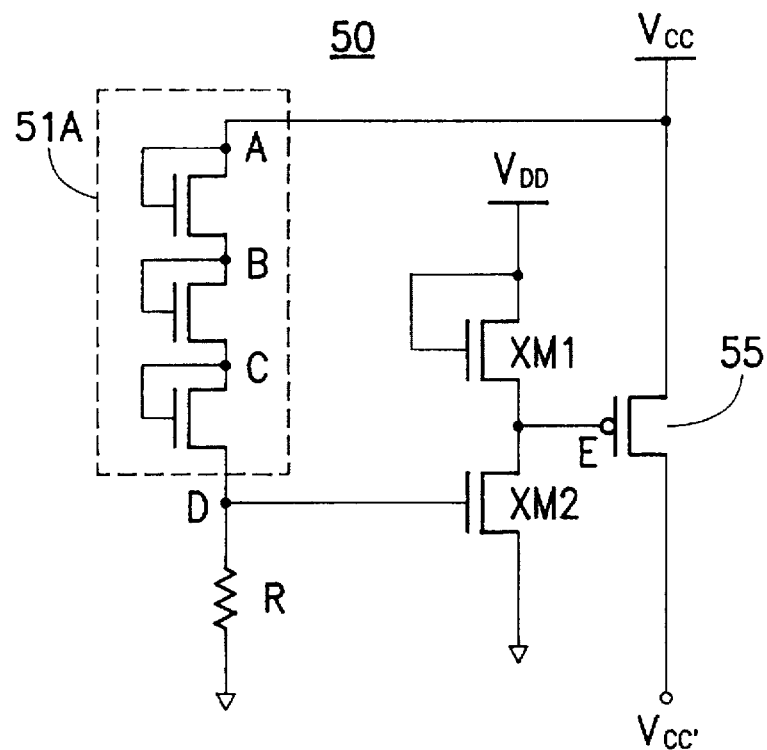
FIG. 5 is one embodiment of a protection circuit of FIG. 4.

An example of the present invention will now be described in accordance with the circuit illustrated in FIG. 5. In this embodiment, the CMOS integrated circuit is biased with first voltage VCC of 5 Volts and second voltage VDD of 3.3 Volts. Referring to FIG. 5, constant voltage subtractor 51A of protection circuit 50 consists of a plurality of series-connected NMOS transistors. The number of transistors in constant voltage subtractor 51A is determined by the full voltage levels of the different power supplies and the threshold voltage of the transistors. In the described embodiment, all of the transistors in protection circuit 50 are supposed to have a threshold voltage VT of about 0.7 Volts. Therefore, three transistors are required in constant voltage subtractor 51A. In order to prevent a large current flowing through constant voltage subtractor 51A, load element R is preferably a resistor having a value of more than 500K Ohm.

When the voltage level of first voltage VCC is lower than 2.8 Volts, i.e., when voltage V(A) at node A of the circuit in FIG. 5 is lower than 2.8 Volts, voltage V(C) at node C is lower than 1.4 Volts, and voltage V(D) at node D is lower than 0.7 Volts. Since the voltage at node D is lower than the threshold voltage of transistor XM2, transistor XM2 is turned off. Therefore, the voltage at node E is less than second voltage VDD by the value of one threshold voltage VT (i.e., voltage V(E) is VDD-VT). The value is about 2.6 Volts in the present example. Since switch 55 is turned off, its internal high impedance isolates the CMOS integrated from first voltage VCC, and no forward current path exists in the CMOS circuit.

When first voltage VCC is higher than 2.8 Volts (i.e., V(A) >2.8 Volts), V(B) is higher than 2.1 Volts, V(C) is higher than 1.4 Volts, and V(D) is higher than 0.7 Volts. Since the voltage at node D is higher than the threshold voltage of transistor XM2, transistor XM2 will be turned on to pull down the voltage at node E. Therefore, voltage V(E) is almost null. The null voltage at node E will turn on switch 55. Since the voltage level of first voltage VCC is almost the same as, or higher than, that of second voltage VDD when switch 55 is turned on, no forward bias path exists in the CMOS circuit. Therefore, CMOS latch-up is prevented by protection circuit 50 of the present invention.

Figure 6:
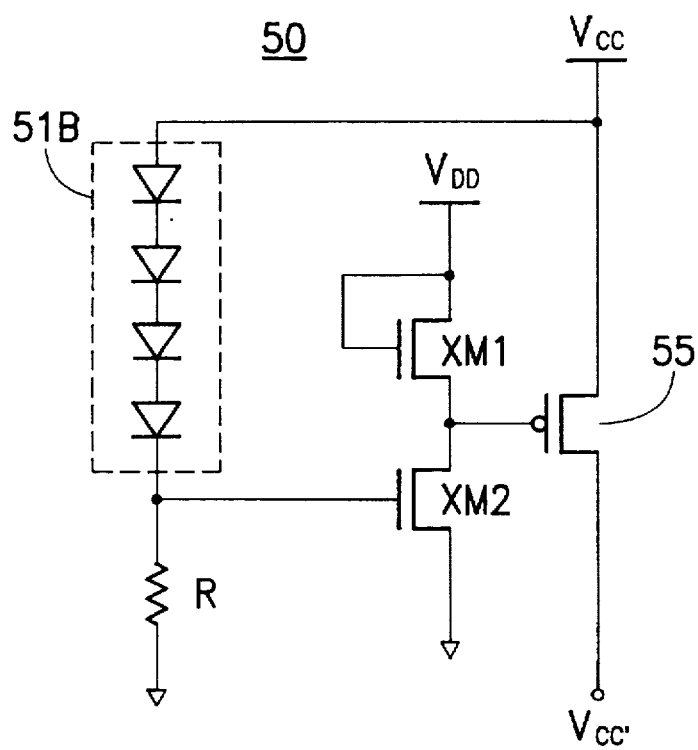
FIG. 6 is another embodiment of a protection circuit of FIG. 4.

Another example, in which constant voltage subtractor 51B is a diode circuit, as illustrated in FIG. 6. Constant voltage subtractor 51B consists of a plurality of series-connected diodes. The number of diodes is determined by the full voltage levels of the different power supplies and the built-in potential of each diode. Except for the subtraction of first voltage VCC by the diode circuit, the protection circuit of FIG. 6 operates similarly to the circuit of FIG. 5. Therefore, other methods which can obtain an appropriate divided first voltage to be compared in the protection circuit, can be utilized in the present invention. The constant voltage subtractor is not limited to the use of a transistor or diode circuits of FIGS. 5 and

What is claimed is:

1. A protection circuit for a CMOS integrated circuit which is biased with a first voltage and a second voltage, comprising:

a voltage divider which receives the first voltage and generates a divided first voltage;

a voltage comparator which is connected to the voltage divider and compares the divided first voltage and the second voltage; and a switch which is controlled by the voltage comparator to isolate the CMOS integrated circuit from the first voltage when the first voltage is lower than the second voltage.

2. The protection circuit as claimed in claim 1, wherein the voltage divider includes:

a constant voltage subtractor which subtracts a constant voltage from the first voltage to generate the divided first voltage; and a load, connected between the constant voltage subtractor and ground.

3. The protection circuit as claimed in claim 1, wherein the voltage comparator includes:

a first NMOS transistor having a drain and a gate connected to the second voltage; and a second NMOS transistor having a drain connected to a source of the first NMOS transistor, a gate connected to the voltage divider, and a source connected to ground;

wherein the switch is controlled by the source of the first transistor.

4. The protection circuit as claimed in claim 1, wherein the switch is a PMOS transistor having a source connected to the first voltage, a gate controlled by the voltage comparator, and a drain connected to the CMOS integrated circuit.

5. The protection circuit as claimed in claim 2, wherein the constant voltage subtractor includes a plurality of series-connected NMOS transistors.

6. The protection circuit as claimed in claim 2, wherein the constant voltage subtractor includes a plurality of series-connected diodes.

* * * * *